(12) United States Patent
Nakamura

(10) Patent No.: US 6,172,008 B1
(45) Date of Patent: Jan. 9, 2001

(54) PROCESS FOR PREPARING HIGH CRYSTALLINITY OXIDE THIN FILM

(75) Inventor: Takao Nakamura, Osaka (JP)

(73) Assignee: Sumitomo Electric Industries Ltd., Osaka (JP)

(*) Notice: Under 35 U.S.C. 154(b), the term of this patent shall be extended for 0 days.

(21) Appl. No.: 08/411,509

(22) Filed: Mar. 28, 1995

(30) Foreign Application Priority Data

Mar. 29, 1994 (JP) .................................................. 6-082405

(51) Int. Cl.[7] .................................................. H01L 39/24
(52) U.S. Cl. .......................... 505/473; 505/480; 505/731; 427/62; 117/108
(58) Field of Search .................. 427/595, 62, 126.3, 427/314; 117/108; 505/473, 48, 732

(56) References Cited

U.S. PATENT DOCUMENTS

| | | | |
|---|---|---|---|
| 5,004,721 | * | 4/1991 | Delozanne ............................... 427/62 |
| 5,039,657 | * | 8/1991 | Goldman et al. ....................... 427/62 |
| 5,350,737 | * | 9/1994 | Harada et al. ......................... 505/477 |

FOREIGN PATENT DOCUMENTS

| | | |
|---|---|---|
| 0305292 | 3/1989 | (EP) . |
| 0565455 | 10/1993 | (EP) . |
| 1-133996 | 5/1989 | (JP) . |
| 2-97402 | 4/1990 | (JP) . |
| 2-302394 | 12/1990 | (JP) . |

OTHER PUBLICATIONS

Sawa et al, Appl. Phys. Lett. 64(5) Jan. 1994, pp. 649–651.*
Siegrist et al, Appl. Phys. Lett. 60(20) May 1992, pp. 2489–2490.*
Berkley et al, IEEE Transactions on Magnetics, vol. 25, No. 2, Mar. 1989, pp. 2522–2525.*
Yokoyama et al, Jpn. J. Appl. Phys. 30(1B) Jan. 1990, pp. L106–L109.*
Bodin et al, Jpn. J. Appl. Phys. 31 (7B) Jul. 1992, pp. L949–L952.*

* cited by examiner

Primary Examiner—Roy V. King
(74) Attorney, Agent, or Firm—Miles & Stockbridge P.C.; John C. Kerins

(57) ABSTRACT

A process for preparing an oxide thin film which has a crystalline, clean and smooth surface on a substrate. The process is conducted by using an apparatus comprising a vacuum chamber in which an oxidizing gas of $O_2$ including $O_3$ can be supplied near the substrate so that pressure around the substrate can be increased while maintaining high vacuum near an evaporation source and Knudsen cell evaporation sources arranged in the vacuum chamber wherein the substrate is heated, molecular beam of constituent atoms of the oxide excluding oxygen are supplied from the K cell evaporation sources, an oxidizing gas is locally supplied to the vicinity of the substrate and a growing thin film is illuminated by ultraviolet.

8 Claims, 3 Drawing Sheets

PROCESS FOR PREPARING HIGH CRYSTALLINITY OXIDE THIN FILM

BACKGROUND OF THE INVENTION

1. Field of the Invention

The present invention relates to a process for preparing oxide thin films having excellent flatness and high crystallinity, and more specifically to a reactive co-evaporation process particularly for preparing thin films of oxide superconductor materials and oxide insulator or dielectric materials, which have clean and smooth surfaces, high crystallinity and excellent superconducting or dielectric properties without any heat treatment after deposition.

2. Description of Related Art

Oxide superconductors have been found to have higher critical temperatures than those of metal superconductors, and therefore considered to have good possibility of practical application. For example, Y—Ba—Cu—O type oxide superconductor has a critical temperature higher than 80 K and it is reported that Bi—Sr—Ca—Cu—O type oxide superconductor and Tl—Ba—Ca—Cu—O type oxide superconductor have critical temperatures higher than 100K.

In case of applying the oxide superconductor to superconducting electronics including superconducting devices and superconducting integrated circuits, the oxide superconductor has to be used in the form of a thin film having a thickness of a few nanometers to some hundreds micrometers. It is considered to be preferable to utilize various deposition methods, such as sputtering methods, laser ablation methods, MBE (Molecular Beam Epitaxy) methods and reactive co-evaporation methods for forming oxide superconductor thin films. In particular, it is possible to form an oxide superconductor thin film by depositing atomic layers layer by layer through utilizing a MBE method and a reactive co-evaporation method. Additionally, in-situ observation during and between depositing thin film is possible so that a high quality oxide superconductor thin film can be obtained by the MBE method and reactive co-evaporation method.

Insulator thin films are also necessary to fabricate superconducting devices and superconducting integrated circuits. Oxide dielectrics such as $SrTiO_3$, MgO, etc. are preferably used for insulator thin films combined with the oxide superconductor. In particular, $SrTiO_3$ has a layered crystal structure similar to that of the oxide superconductor so that it is possible to accurately control qualities and thickness of its thin films by depositing atomic layers layer by layer through utilizing a MBE method and a reactive co-evaporation method.

In order to deposit an oxide superconductor thin film and an oxide dielectric thin film on a substrate by the MBE method and the reactive co-evaporation method, constituent elements of the oxide excluding oxygen are supplied as molecular beams towards the substrate by using Knudsen's cell (abbreviated to K cell hereinafter) type molecular beam sources. In addition, an oxidizing gas such as $O_2$ including $O_3$, $NO_2$ or $N_2O$ is supplied near the substrate so that the molecular beams are oxidized so as to form the oxide thin film on the substrate.

In general, when a thin film is deposited by the MBE method and the reactive co-evaporation method, a pressure of deposition atmosphere is reduced as low as possible so as to prevent contamination in the process. Namely, vacuum level of the deposition atmosphere is increased as high as possible.

However, in case of an oxide thin film, a above distinctive process in which an oxidizing gas is supplied near the substrate during deposition of the oxide thin film is employed. It is also preferable, even in this case, to reduce the pressure in the vicinity of the substrate as low as possible so as to prevent contamination of impurities into the oxide thin film.

For this purpose, in a prior art, the pressure in the vicinity of the substrate has been adjusted to $1 \times 10^{-5}$ Torr during the deposition. However, it may be sometimes difficult to cause sufficient oxidation near a surface of the substrate.

In order to prevent diffusion of constituent elements of the substrate or a lower layer into a growing thin film, it is preferable to reduce a substrate temperature during deposition of the thin film as low as possible. However, oxidation does not sufficiently progress at the low substrate temperature. In addition, enough migration of atoms deposited on the substrate does not occur at the low substrate temperature so that a surface of the thin film becomes uneven.

SUMMARY OF THE INVENTION

Accordingly, it is an object of the present invention to provide a process for preparing an oxide thin film having clean and smooth surfaces with high crystallinity and excellent properties at a low substrate temperature under a low pressure (high vacuum level), which has overcome the above mentioned defects of the conventional ones.

Another object of the present invention is to provide a process for preparing an oxide dielectric thin film, which has overcome the above mentioned defects of the conventional ones.

The above and other objects of the present invention are achieved in accordance with the present invention by a process for preparing a film formed of an oxide material on a substrate by using an apparatus comprising a vacuum chamber in which an oxidizing gas of $O_2$ including $O_3$ can be supplied near the substrate so that pressure around the substrate can be increased while maintaining high vacuum around an evaporation source and Knudsen cell evaporation sources arranged in the vacuum chamber wherein the substrate is heated, molecular beam of constituent atoms of the oxide excluding oxygen are supplied from the K cell evaporation sources, an oxidizing gas is locally supplied to the vicinity of the substrate and a growing thin film is illuminated by ultraviolet.

According to the present invention, a growing thin film is illuminated by ultraviolet which promotes reactions near a surface of the growing thin film and migration of deposited atoms. Therefore, a high quality oxide film of high crystallinity, having a smooth surface and excellent properties can be obtained even at a low substrate temperature and under a low pressure in the vicinity of the substrate. For example, a high quality c-axis orientated $Y_1Ba_2Cu_3O_{7-x}$ oxide superconductor thin film can be deposited even at a substrate temperature of 630 to 670° C. and under a pressure of $5 \times 10^{-7}$ to $5 \times 10^{-6}$ Torr in the vicinity of the substrate. In a prior art, a c-axis orientated $Y_1Ba_2Cu_3O_{7-x}$ oxide superconductor thin film has been deposited at a substrate temperature of not lower than 700° C. and under a pressure of not lower than $1 \times 10^{-5}$ Torr in the vicinity of the substrate.

In case of a $SrTiO_3$ oxide dielectric film, it can be deposited even at a substrate temperature of 330 to 500° C. and under a pressure of $5 \times 10^{-7}$ to $5 \times 10^{-6}$ Torr in the vicinity of the substrate. In a prior art, a $SrTiO_3$ oxide dielectric film has been deposited at a substrate temperature of not lower than 500° C. and under a pressure of not lower than $1 \times 10^{-5}$ Torr in the vicinity of the substrate.

The lower pressure can reduce contaminants, in particular hydrocarbonates or metal carbides, deposited on or within the oxide thin film prepared by the process in accordance with the present invention.

In accordance with the present invention, the ultraviolet preferably has a wavelength of 150 to 300 nanometers. These wavelength are suitable to promote reactions near a surface of a growing thin film and migration of deposited atoms.

In addition, the substrate can be formed of an insulating substrate, preferably an oxide single crystal substrate such as MgO, $SrTiO_3$, $CdNdAlO_4$, etc. These substrate materials are very effective in forming or growing a crystalline film having a high degree of crystallinity.

However, it is possible to deposit an oxide thin film on an oxide superconductor layer with little inter diffusion between them, in accordance with the present invention. For example, a $SrTiO_3$ thin film can be deposited on a $Y_1Ba_2Cu_3O_{7-x}$ oxide superconductor layer so as to prevent inter diffusion between them so that a clear $SrTiO_3$/$Y_1Ba_2Cu_3O_{7-x}$ interface should be formed. This process is favorably applicable to form a gate structure of a superconducting field effect device having a superconducting channel of an oxide superconductor.

The above and other objects, features and advantages of the present invention will be apparent from the following description of preferred embodiments of the invention with reference to the accompanying drawings.

DESCRIPTION OF THE PREFERRED EMBODIMENTS

Figure 1:
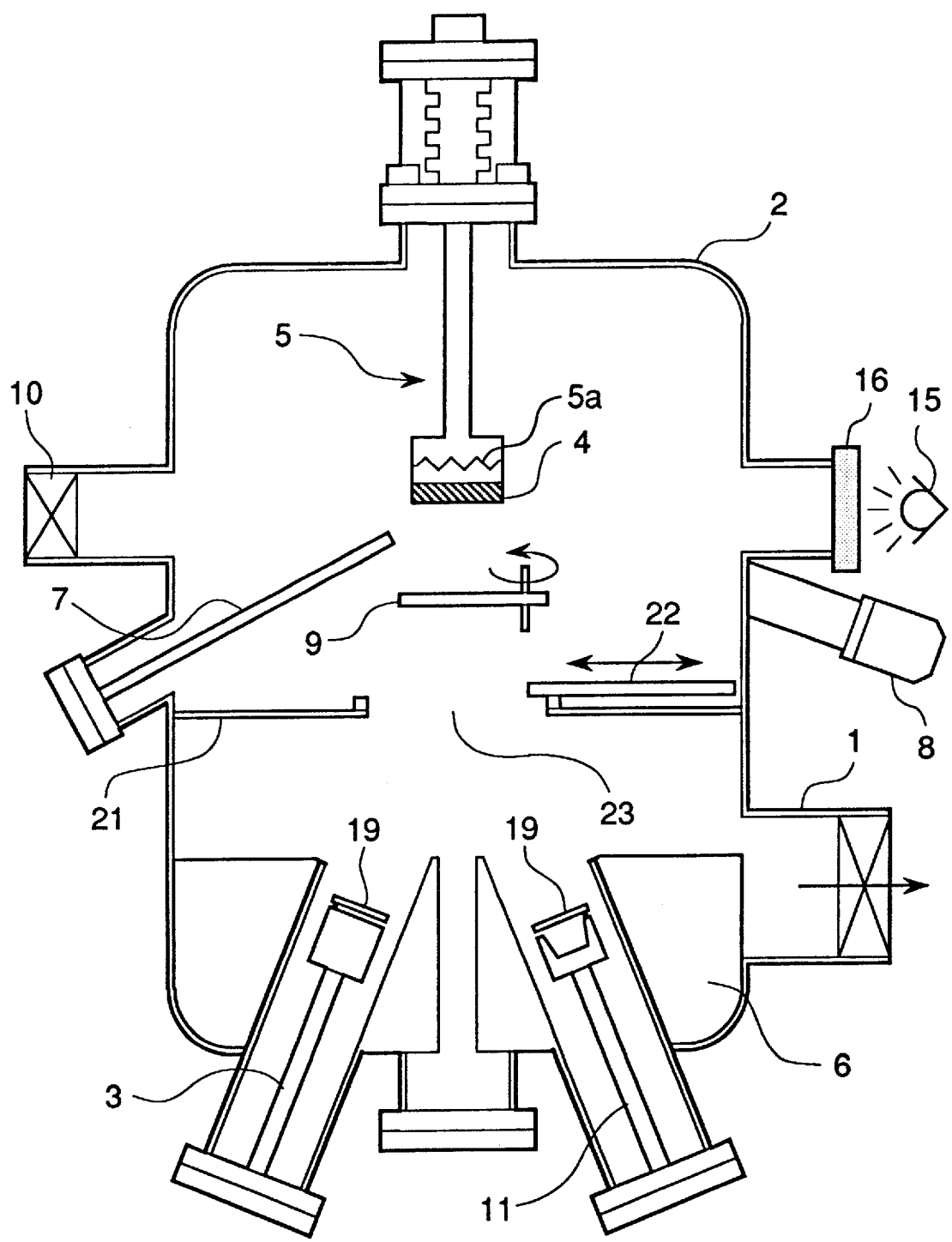
FIG. 1 is a diagrammatic sectional view of a film deposition apparatus which can be used for conducting the deposition process in accordance with the present invention.

Referring to FIG. 1 there is shown a diagrammatic sectional view of a film deposition apparatus which can be used for carrying out the process in accordance with the present invention.

The shown film deposition apparatus basically includes a vacuum chamber 2 provided with a main evacuating apparatus 1, at least one K (Knudsen's) cell 3 and at least one electron beam gun 11 provided at a bottom of the vacuum chamber 2, and a sample holder 5 provided at a top of the vacuum chamber 2 for holding a substrate 4 on which a film is to be deposited. The sample holder 5 is associated with a heater 5a for heating the substrate. In addition, the vacuum chamber 2 is also provided with a port 10 for exchanging a sample, a liquid nitrogen shroud 6 for forming a cold trap around an evaporation source of the K cell, and a RHEED device 8 for observing a thin film roughness during the deposition. In front of the substrate held by the sample holder, a shutter 9 is located for controlling a deposition time during the deposition process. The K cell 3 and the electron beam gun 11 are provided with openable shutters 19.

In addition, a nozzle 7 is provided so as to introduce an oxidizing gas such as $O_2$, $O_3$, $NO_2$, $N_2O$, etc. in proximity of the substrate 4 held by the sample holder 5, so that the oxidizing gas can be supplied to form an oxygen-enriched atmosphere in the proximity of the substrate 4 in order to oxidize metal molecular beams incoming from the evaporation source in the course of the film deposition.

Furthermore, the film deposition apparatus additionally includes a partitioning plate 21 for dividing the vacuum chamber 2 into a first sub-chamber which is constituted of a lower portion of the vacuum chamber defined below the partitioning plate 21 and which is coupled to the K cell 3, the electron beam gun 11 and the main evacuating apparatus 1, and a second sub-chamber which is constituted of an upper portion of the vacuum chamber defined above the partitioning plate 21 and in which sample holder 5 is located. The partitioning plate 21 includes a through opening 23 formed at a center thereof. The position of the opening 23 is determined to ensure that a beam emitted from K cell 3 and the electron beam gun 11 toward the substrate 4 is not obstructed by the partitioning plate 21. In addition, the size of the opening 23 is determined to enable restricted molecular flows between the first sub-chamber and the second sub-chamber so that a pressure difference can be created between the first sub-chamber and the second sub-chamber when the opening 23 is open. Therefore, the partitioning plate 21 having the through opening 23 constitutes a vacuum impedance.

A gate valve 22 is provided on the partitioning plate 21 for hermetically closing the opening 23 of the partitioning plate 21, so as to completely shut off the molecular flows between the first sub-chamber and the second sub-chamber when the gate valve 22 is closed. An opening and closing of this gate valve 22 is controlled from the outside of the film deposition apparatus by a not-shown means.

In addition, an auxiliary evacuating apparatus (not shown) is coupled to the second sub-chamber for evacuating the second sub-chamber to an ultra-high vacuum when the gate valve 22 is closed. The auxiliary evacuating apparatus is constituted of a cryopump. On the other hand, the main evacuating apparatus 1 is constituted of a diffusion pump.

Furthermore, the apparatus comprises an ultraviolet light source 15, for example a low pressure mercury lamp, at outside of the vacuum chamber 2, which can illuminate the substrate 4 through a view port 16 having a window of sapphire or artificial quartz.

EXAMPLE 1

A $Y_1Ba_2Cu_3O_{7-x}$ oxide superconductor thin film of $SrTiO_3$ was prepared by the process according to the present invention using the apparatus of FIG. 1.

At first, a $SrTiO_3$ (100) substrate 4 was attached to the sample holder 5, and metal yttrium, metal barium and metal copper were put into tantalum crucibles held within the three K cells 3 used for evaporation sources. Thereafter, the chamber 2 was closed and the gate valve 22 was opened. The vacuum chamber 2 was evacuated by the main evacuating apparatus 1 and the auxiliary evacuating apparatus to an ultra-high vacuum of which the pressure was lower than $1 \times 10^{-9}$ Torr in which background pressure the film deposition by the co-evaporation process was available. Succeedingly, an oxidizing gas of $O_2$ including more than 70 volume percent $O_3$ was supplied from the nozzle 7 so as to increase the pressure in the vicinity of the substrate 4 to $1 \times 10^{-6}$ Torr.

As mentioned above, the vacuum chamber 2 was provided with the vacuum impedance (the partitioning plate 21 having the through opening 23), a pressure difference of about one digit or more was created between the first sub-chamber and the second sub-chamber. Pressure of the first sub-chamber was maintained ultra low so that metals evaporation sources were not oxidized and vapors could be efficiently generated after the oxidizing was supplied. In addition, the oxidizing gas jetted from the nozzle 7 was struck onto a deposition surface of the substrate, the substantial pressure of the oxidizing gas on the deposition surface of the substrate was further elevated.

Then, the substrate 4 was heated by the heater 5a to a temperature of 630° C. The K cell 3 of metal yttrium was heated to a temperature of 1220° C., the K cell 3 of metal barium was heated to a temperature of 620° C. and the K cell 3 of metal copper was heated to a temperature of 1000° C.

When molecular beams had become to be stably generates from the evaporation sources, the substrate 4 was illuminated by the ultraviolet light source 15 with ultraviolet light having a wavelength of 172 nanometers and the shutters 9 and 19 were opened so as to start deposition of the oxide superconductor thin film onto the substrate 4. At this time, a surface roughness of this deposited film was observed by the RHEED device 8.

In this embodiment, the ultraviolet light source 15 was a low pressure mercury lamp of wave length of 172 nanometers having an output of 20 watt, which was disposed outside of the chamber 2 at a distance of 250 mm from the substrate 4.

The ultraviolet light source 15 is preferably a low pressure mercury lamp of wave length of around 150 to 300 nanometers having an output of around 5 to 100 watt, which is preferably disposed at a distance of 100 to 500 mm from the substrate 4.

The oxide superconductor thin films were grown up to a thickness of 90 nanometers at a deposition rate of 1 nanometer/minute. The deposition rate is preferably 0.5 to 2 nanometers/minute.

When the oxide superconductor thin film had reached a thickness of 90 nanometers, the substrate 4 was cooled down to the room temperature. While the substrate 4 was cooled down, it was maintained in the condition in which the oxide superconductor thin film was deposited. In addition, the deposited thin film was kept to be illuminated by the ultraviolet during the cooling.

After the oxide superconductor thin film was obtained, crystal structures and surface conditions of the oxide superconductor thin films were evaluated by RHEED, LEED and XPS without exposing the oxide superconductor thin film to the air. It became clear from RHEED images that the oxide superconductor thin film had a smooth surface, which was considered to be a result of an increase in migration of deposited atoms by means of illumination of the ultraviolet. In LEED images, there were observed 1×1 spots so that it became clear that the oxide superconductor thin film had a clean and crystalline surface.

In XPS spectra, no peak of C was observed. Therefore, there was no composition of C which was a contaminant on the surface of the oxide superconductor thin film prepared by the above process in accordance with the present invention.

As explained above, an oxide superconductor thin film which has an excellent surface condition can be obtained without any post-deposition treatment by the process in accordance with the present invention. The oxide superconductor thin film prepared by the process in accordance with the present invention has a high crystallinity, clean and excellent superconductive surface. Therefore, the oxide superconductor thin film is suitable for a lower layer of a stacked films.

EXAMPLE 2

A thin film of $SrTiO_3$ dielectric oxide was continuously deposited on the above $Y_1Ba_2Cu_3O_{7-x}$ oxide superconductor thin film by using the same apparatus without breaking vacuum.

After the observation of the oxide superconductor thin film, an oxidizing gas of $O_2$ including more than 70 volume percent $O_3$ was again supplied from the nozzle 7 so as to increase the pressure in the vicinity of the substrate 4 to $1\times10^{-6}$ Torr.

Then, the substrate 4 was heated to a temperature of 450° C. The K cell 3 of metal strontium was heated to a temperature of 600° C. and the K cell 3 of metal titanium was heated to a temperature of 1500° C. The substrate temperature is preferably 430 to 580° C., the temperature of metal strontium is preferably 450 to 600° C. and the temperature of metal titanium is preferably 1430° C. to 1550° C.

When molecular beams had become to be stably generates from the evaporation sources, the oxide superconductor thin film on the substrate 4 was illuminated by the ultraviolet light source 15 with ultraviolet light having a wavelength of 172 nanometers and the shutters 9 and 19 were opened so as to start deposition of the dielectric oxide thin film onto the oxide superconductor thin film. At this time, a surface roughness of this deposited film was observed by the RHEED device. The dielectric oxide thin film was grown up to a thickness of 125 nanometers at a deposition rate of 1.2 nanometer/minute. The deposition rate is preferably 0.5 to 2 nanometers/minute.

When the dielectric oxide thin film has reached a thickness of 125 nanometers, the substrate 4 was cooled down to the room temperature. While the substrate 4 was cooled down, it was maintained in the condition in which the dielectric oxide thin film was deposited. In addition, the deposited thin film was kept to be illuminated by the ultraviolet during the cooling.

After the dielectric oxide thin film was obtained, a crystal structure and a surface condition of the dielectric oxide thin film was evaluated by RHEED, LEED and XPS without exposing the dielectric oxide thin film to the air. In addition, temperature dependence of a dielectric constant of the $SrTiO_3$ dielectric oxide thin film was measured.

Figure 2:
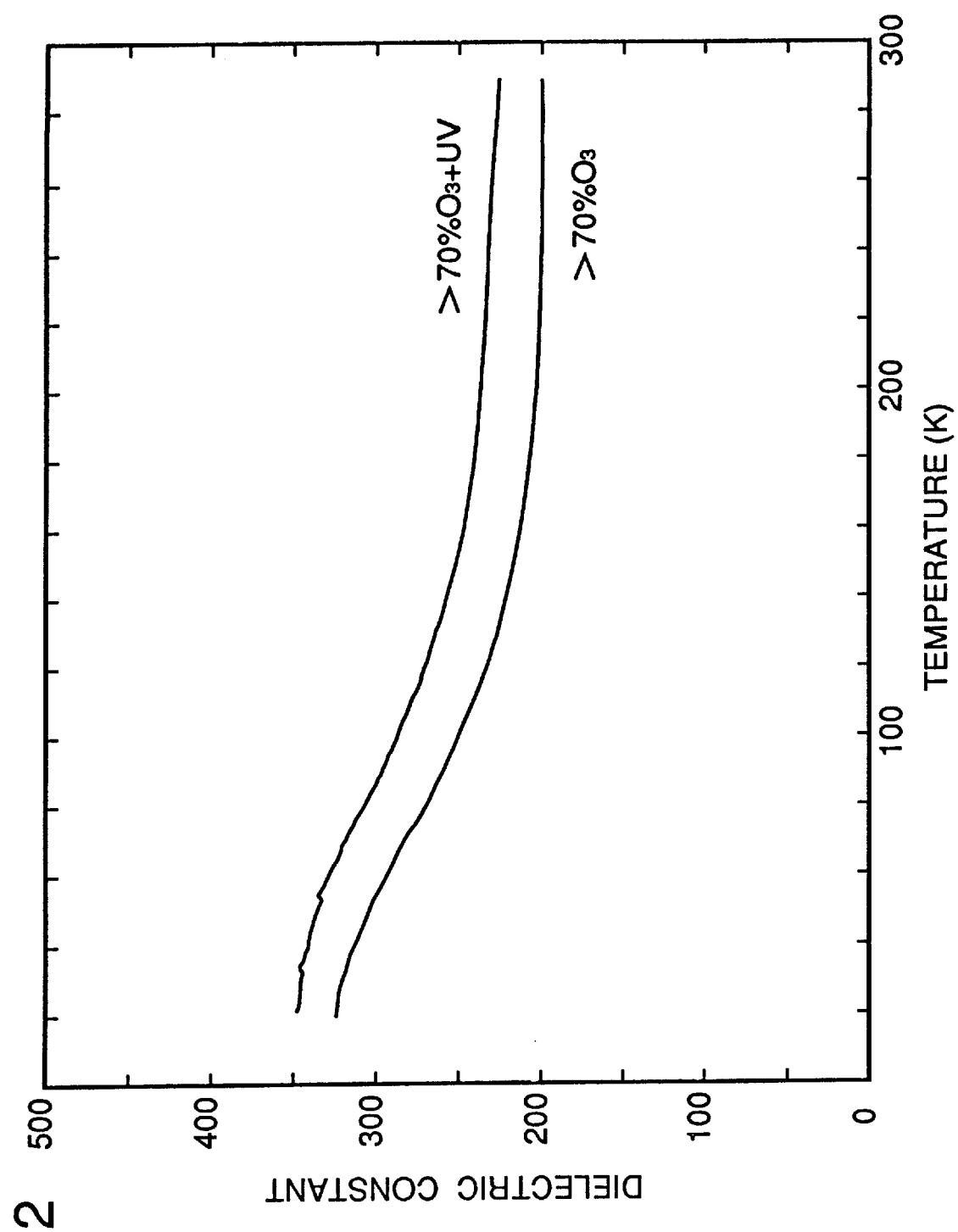
FIG. 2 is a graph of dielectric constants of $SrTiO_3$ thin films deposited by the process in accordance with the present invention and a process of a prior art against temperatures.

FIG. 2 is a graph of dielectric constants of $SrTiO_3$ thin films deposited by the process in accordance with the present invention and a process of a prior art against temperatures. As shown in FIG. 2, the $SrTiO_3$ dielectric oxide thin film deposited in accordance with the present invention had higher dielectric constants at an extremely low temperature to the room temperature than a $SrTiO_3$ dielectric oxide thin film deposited by a process of a prior art without illumination of ultraviolet. It was considered that the improvement of the dielectric constants was due to promotion of reaction near the surface of the growing film by the illumination of ultraviolet.

Figure 3A:
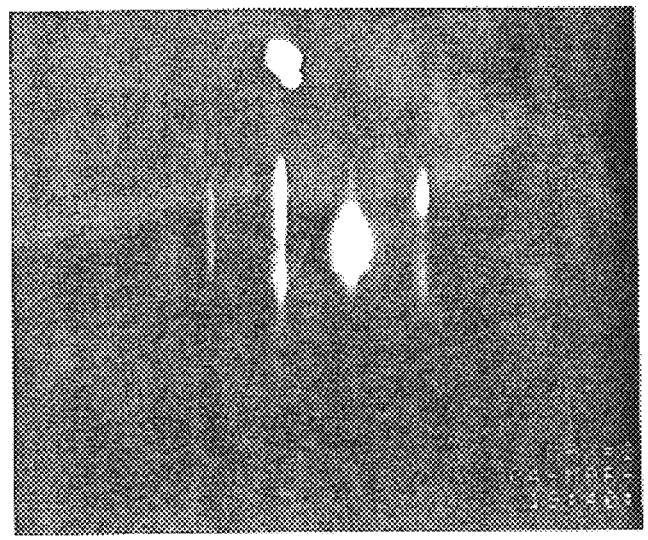
FIG. 3A is a RHEED (Refractive High Energy Electron Diffraction) image of a $SrTiO_3$ thin film deposited by the process in accordance with the present invention.
Figure 3B:
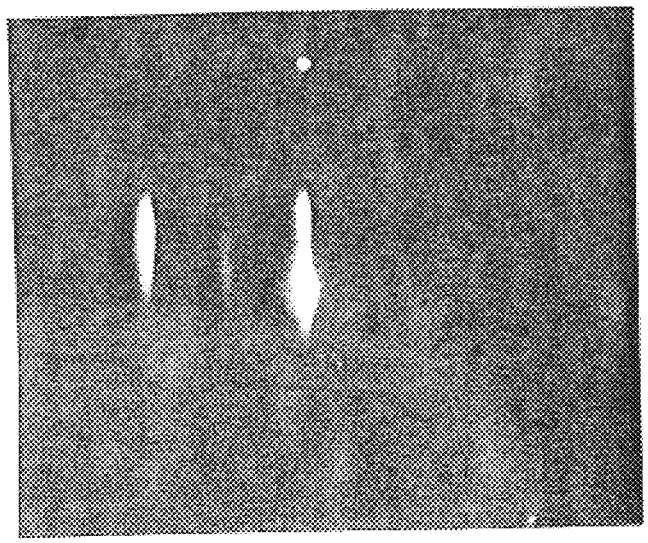
FIG. 3B is a RHEED image of a $SrTiO_3$ thin film deposited by the process of a prior art.

FIGS. 3A and 3B shows a RHEED images of the dielectric oxide thin film prepared by the above process in accordance with the present invention and by a process a prior art without illumination of ultraviolet. From FIGS. 3A and 3B, it became clear that the dielectric oxide thin film prepared in accordance with the present invention had a more smooth surface, which was considered to be a result of an increase of migration of deposited atoms by the illumination of ultraviolet. In addition, an interface between the $Y_1Ba_2Cu_3O_{7-x}$ oxide superconductor thin film and the $SrTiO_3$ dielectric oxide thin film was clearly formed in the above stacked structure.

As explained above, an oxide thin film which has an excellent surface condition can be obtained without any post-deposition treatment by the process in accordance with the present invention. The oxide thin film prepared by the process in accordance with the present invention has a high crystallinity, clean and planar surface. Therefore, the oxide thin film is suitable for a lower layer of a stacked films.

The relatively low substrate temperature of less than 500° C. during $SrTiO_3$ thin film deposition leads the way to the semiconductor device application, such as gate insulator or capacitor of ferroelectric random access memory (FRAM).

The invention has thus been shown and described with reference to the specific embodiments. However, it should be noted that the present invention is in no way limited to the details of the illustrated structures but converts and modifications may be made within the scope of the appended claims.

What is claimed is:

1. A process for preparing a film formed of an oxide material on a substrate by using an apparatus comprising a vacuum chamber in which an oxidizing gas of $O_2$ including $O_3$ is supplied near the substrate so that pressure around the substrate is increased to $5\times10^{-7}$ to $5\times10^{-6}$ Torr while maintaining a high vacuum of $1\times10^{-11}$ to $1\times10^{-9}$ Torr around an evaporation source and Knudsen cell evaporation sources arranged in the vacuum chamber wherein the substrate is heated, molecular beam of constituent atoms of the oxide excluding oxygen are supplied from the K cell evaporation sources, an oxidizing gas of $O_2$ including about 70 volume percent $O_3$ is locally supplied to the vicinity of the substrate and a growing thin film is illuminated by ultraviolet having a wavelength of 150 to 172 nanometers so as to increase the $O_3$ content of the oxidizing gas.

2. A process as claimed in claim 1, wherein the ultraviolet is produced by a low pressure mercury lamp.

3. A process as claimed in claim 2, wherein the low pressure mercury lamp is disposed at a distance of 100 to 500 millimeters from the substrate.

4. A process as claimed in claim 2, wherein the low pressure mercury lamp has an output of 5 to 100 watt.

5. A process claimed in claim 1, wherein the process is conducted while the oxidizing gas is supplied onto a deposition plane of the substrate.

6. A process as claimed in claim 1, wherein the film is a c-axis orientated $Y_1Ba_2Cu_3O_{7-x}$ oxide superconductor thin film.

7. A process as claimed in claim 6, wherein the process is conducted at a substrate temperature of 630 to 670° C.

8. A process as claimed in claim 7, wherein the process is conducted at a substrate temperature of 650° C.

* * * * *